United States Patent
Chuang et al.

(10) Patent No.: US 8,349,732 B2
(45) Date of Patent: Jan. 8, 2013

(54) IMPLANTED METAL SILICIDE FOR SEMICONDUCTOR DEVICE

(75) Inventors: Harry Chuang, Austin, TX (US);
Hung-Chih Tsai, Daliao (TW);
Keh-Chiang Ku, Sindan (TW);
Kong-Beng Thei, Hsin-Chu (TW);
Mong Song Liang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 107 days.

(21) Appl. No.: 12/176,133

(22) Filed: Jul. 18, 2008

(65) Prior Publication Data

US 2010/0013029 A1 Jan. 21, 2010

(51) Int. Cl.
*H01L 29/78* (2006.01)
*H01L 21/44* (2006.01)

(52) U.S. Cl. ........ 438/664; 438/528; 438/592; 438/683; 257/412; 257/E29.111

(58) Field of Classification Search .................. 257/412, 257/E29.111; 438/664
See application file for complete search history.

(56) References Cited

U.S. PATENT DOCUMENTS

| | | | | |
|---|---|---|---|---|
| 4,683,645 A | * | 8/1987 | Naguib et al. | 438/297 |
| 5,780,361 A | | 7/1998 | Inoue | |
| 5,824,600 A | | 10/1998 | Byun et al. | |
| 5,874,342 A | | 2/1999 | Tsai et al. | |
| 5,917,223 A | * | 6/1999 | Ohuchi et al. | 257/384 |
| 6,096,647 A | | 8/2000 | Yang et al. | |
| 6,121,090 A | * | 9/2000 | Wu | 438/275 |
| 6,159,856 A | | 12/2000 | Nagano | |
| 6,376,372 B1 | * | 4/2002 | Paranjpe et al. | 438/682 |
| 6,380,057 B1 | | 4/2002 | Buynoski et al. | |
| 6,559,018 B1 | | 5/2003 | Liu et al. | |
| 6,825,115 B1 | * | 11/2004 | Xiang et al. | 438/662 |
| 7,067,410 B2 | | 6/2006 | Wieczorek et al. | |
| 7,109,443 B2 | | 9/2006 | Knutson et al. | |
| 2007/0111421 A1 | * | 5/2007 | Cabral et al. | 438/199 |

* cited by examiner

*Primary Examiner* — Hsien Ming Lee
*Assistant Examiner* — Walter H Swanson
(74) *Attorney, Agent, or Firm* — Slater & Matsil, L.L.P.

(57) ABSTRACT

A device and a method for forming a metal silicide is presented. A device, which includes a gate region, a source region, and a drain region, is formed on a substrate. A metal is disposed on the substrate, followed by a first anneal, forming a metal silicide on at least one of the gate region, the source region, and the drain region. The unreacted metal is removed from the substrate. The metal silicide is implanted with atoms. The implant is followed by a super anneal of the substrate.

19 Claims, 7 Drawing Sheets

US 8,349,732 B2

IMPLANTED METAL SILICIDE FOR SEMICONDUCTOR DEVICE

TECHNICAL FIELD

The present invention relates generally to the manufacturing of semiconductor devices, and more particularly to a structure and method for manufacturing low resistance $NiSi_x$.

BACKGROUND

Semiconductor devices are manufactured by forming active regions in a semiconductor substrate, depositing various insulating, conductive, and semiconductive layers over the substrate, and patterning them in sequential steps. After a semiconductor device such as a CMOS device has been created, electrical access to the device must be provided. This electrical contact may, for reasons of device performance, be a low-resistivity contact. Silicide layers may provide low resistivity contacts. Salicidation is the term used for self-aligned silicide. The process of salicidation is well known in the art. Salicided layers can be formed comprising titanium silicide ($TiSi_2$), cobalt silicide ($CoSi_x$), and nickel silicide ($NiSi_x$), for example.

The method of self-aligned silicide (salicide) formation, which self-registers with the contacts at the top of the polysilicon gate, the source, and the drain, solves a problem of critical dimension tolerance. Salicides are typical in high-density CMOS devices. There are, however, problems associated with prior art methods of salicide formation. One main problem is that the salicidation process of converting a metal to its silicide is achieved by the consumption of silicon underlying the metal, and this means the consumption of substrate silicon in the regions of the source and drain. The source/drain junctions may be shallow in sub-half-micron devices and the salicidation process may cause the junctions to become thin. Further, a salicidation reaction may consume substrate silicon unevenly, leading to ragged source/drain junctions or the creation of spikes that may penetrate through the junctions near the edges of the source/drain areas.

Another issue in device salicide processing is the use of silicide films for stress enhanced device performance. Among other layers, the silicide films may add beneficial stresses to the NMOS and PMOS transistors. An added complication is that the NMOS and PMOS transistors may benefit from different stresses, for example, an NMOS device may benefit from a tensile stress lateral across the channel region, while a lateral stress across the PMOS channel is detrimental. Producing low resistance, advantageously stressed silicide films has been a challenge.

SUMMARY OF THE INVENTION

These and other problems are generally solved or circumvented, and technical advantages are generally achieved by performing a super anneal following a post-silicide formation silicon implant.

In accordance with an illustrative embodiment of the present invention, a method for forming a metal silicide is presented. A device, which includes a gate region, a source region, and a drain region, is formed on a substrate. A metal is disposed on the substrate, followed by a first anneal, forming a metal silicide on at least one of the gate region, the source region, and the drain region. The unreacted metal is removed from the substrate. The metal silicide is implanted with atoms. The implant is followed by a super anneal of the substrate.

Advantages of preferred embodiments of the present invention include providing a low resistance metal salicide. A further advantage of an illustrative embodiment is the beneficial stresses produced on the device by the metal salicide, which may result in device performance improvements, specifically $I_{on}$ gain. $I_{on}$ gain refers to the drive current of a transistor when the transistor is in its fully on state.

The foregoing has outlined rather broadly the features and technical advantages of an illustrative embodiment in order that the detailed description of the invention that follows may be better understood. Additional features and advantages of an illustrative embodiment will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the illustrative embodiments as set forth in the appended claims.

BRIEF DESCRIPTION OF THE DRAWINGS

For a more complete understanding of the illustrative embodiments, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale. Further the terms "salicide" and "silicide" may be used interchangeably herein, as is typical in the art.

DETAILED DESCRIPTION OF ILLUSTRATIVE EMBODIMENTS

The making and using of the presently preferred embodiments are discussed in detail below. It should be appreciated, however, that an illustrative embodiment provides many applicable inventive concepts that can be embodied in a wide variety of specific contexts. The specific embodiments discussed are merely illustrative of specific ways to make and use the invention, and do not limit the scope of the invention.

The present invention will be described with respect to illustrative embodiments in a specific context, namely a semiconductor device with a salicide. The invention may also be applied, however, to other semiconductor devices comprising a silicide layer.

Figure 1B:
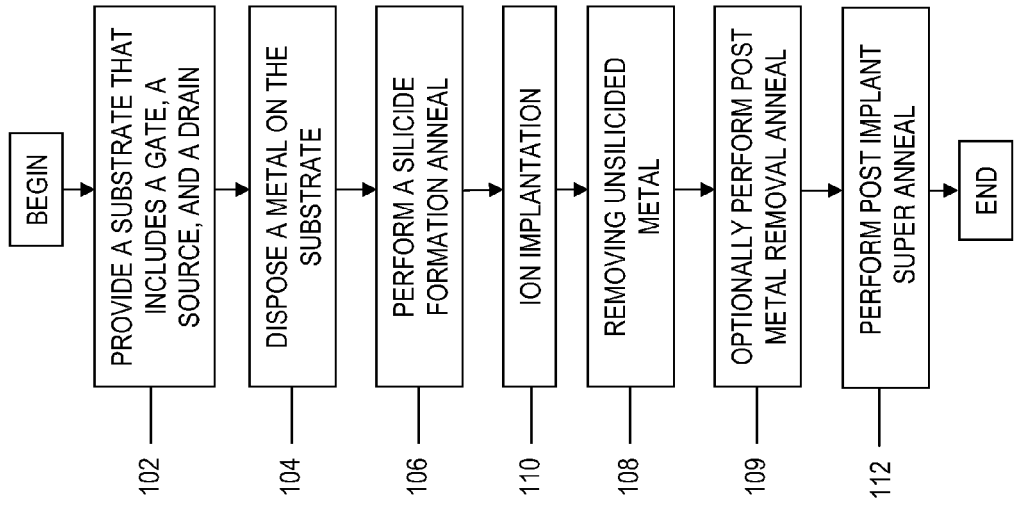
FIGS. 1A and 1B are flow charts depicting the process steps of manufacturing a low resistance $NiSi_x$, in accordance with an illustrative embodiment.
Figure 1A:
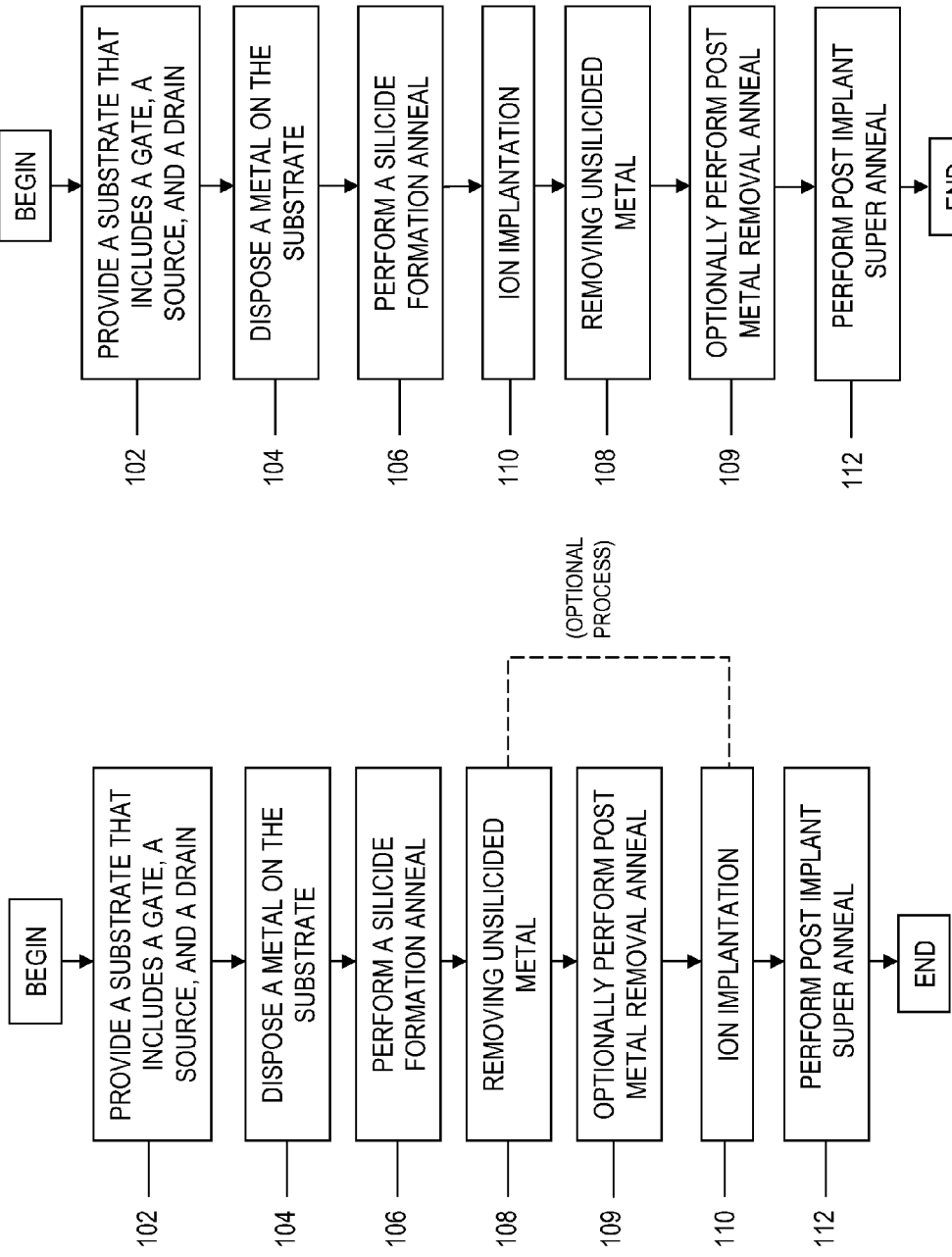

Turning to FIG. 1A, a process flow of an illustrative embodiment is shown. A substrate with a gate, a source, and a drain is provided (step 102). An NMOS transistor, a PMOS transistor, or both (CMOS) may be included.

A metal or metal alloy is disposed on the substrate (step 104). Refractory metals, such as tungsten (W), molybdenum (Mo), niobium (Nb), tantalum (Ta), rhenium (Re) may be used. Further, cobalt or titanium may be used, or preferably, nickel is disposed on the substrate surface during step 104. Metals may be added to the wafer surface using any of a variety of deposition methods, for example, chemical vapor deposition (CVD) or sputtering.

A silicide formation anneal is implemented to form the silicide layer (step 106). The silicide formation anneal may be accomplished in a furnace type anneal. However, a rapid thermal anneal (RTA) is preferred. RTA includes quickly raising the temperature of the wafer and holding it at that temperature for a time long enough to successfully perform a fabrication process. RTP systems employ a light source and reflectors to heat the bulk of the semiconductor wafer. The light source may be a bank of Halogen lamps that emit radiant energy that is focused on the wafer by the reflectors. In an embodiment, a preferred silicide formation anneal recipe may be from 200° C. to 300° C. for a duration of between 15-60 seconds.

The un-reacted metal is removed (step 108). The un-reacted metal removal may be a wet or dry etch process according to processes known in the art, preferably a wet etch process. An optional post metal removal anneal may follow (step 109). The post metal removal anneal may be an RTA anneal with temperatures between 350° C. and 550° C., with a duration between 15-60 seconds.

In one embodiment, the ion implant is implemented following a post formation anneal (step 110). In another embodiment, the implantation step 110 precedes the removal of the un-reacted metal. In yet another embodiment, the ion implant follows the removal of the un-reacted metal, but no post metal removal anneal is performed. In any case, an ion implant is performed. In a preferred embodiment, silicon, germanium or the like, is implanted into the silicide layer. The implanted dose may be between 1 E14 and 1E16 atms/cm$^2$. The implantation may occur wherein the energy of the implant may be less than 1 KeV. Further the implant may be patterned or an unpatterned implant.

Following the implant in step 110, the substrate undergoes a super anneal (step 112). A super anneal refers to all anneals encompassing an anneal time less than 10 seconds and an anneal temperature between about 950-1300° C. A super anneal imparts light or heat energy suddenly or substantially instantaneously (or in transient bursts) for a duration of time between about 1 nanosecond and about 10 seconds, like a flash anneal or a laser anneal. A super annealing technique employs very high temperatures to minimize diffusion. A super anneal may be performed by a flash anneal, a laser anneal, or the like.

Flash annealing systems, unlike RTA systems, utilize non-halogen lamps such as Xe-arc lamps, which may provide a short burst of intense optical energy achieving wafer surface temperatures, which may be in excess of 1300° C. The short bust of optical energy may have a duration, for example, on the order of a millisecond. A flash anneal system may comprise a radiation light source, reflectors, and a backside heating device.

Flash lamps may be a plasma type, such as a gaseous discharge lamp that is capable of producing high-intensity flashes of light for short durations. Examples of types of flash lamps that are capable of heating the substrate surface to the desired temperature within the desired time constraints include, but are not limited to, Xenon, Mercury, or Krypton flash lamps. For embodiments using a silicon substrate, these respective temperatures could be approximately 800 and 1409 degrees C. Substrate exposure in this range may be limited to prevent excessive diffusion. Flash lamp processes may range from several milliseconds to less then one millisecond.

A portion of the radiation generated from the flash lamps 12 may travel directly towards the target substrate, while radiation projected upwards may be reflected off the multi-zone reflecting device back towards the substrate. The temperature gradient incident on a portion of the substrate surface may depend on several factors including, but not limited to, the distance to the flash lamps, the wavelength of the radiation, whether the radiation is direct or reflected, the reflectivity of the reflector, and the reflectivity of the substrate. A multi-zone reflector may be reflectively contoured such that areas of the substrate that have less direct radiation from the flash lamps may receive reflected radiation from zones of the multi-zone reflector with a higher reflectivity. Conversely, the portions of the substrate that have more direct radiation from the flash lamps may need less reflected radiation, and therefore the corresponding reflector zone may employ reflectors with a relatively low reflectivity. Reflecting zones may be implemented to complement a particular flash lamp reactor. A plate-type reflecting device may be axis-symmetrical around a flash reactor centerline. Reflectors may be formed into any suitable geometric shape. For example, a reflector may be flat, spherical, elliptical, or parabolic.

In another embodiment, the super anneal is a laser anneal. A laser anneal is performed by shaping a laser beam generated from a laser oscillation source with an optical system that may include a plurality of lenses and scanning the substrate with the laser beam. A laser beam with a large energy generated from an oscillation source is shaped by a predetermined optical system and is irradiated onto a large area, thereby to realize annealing with a high throughput.

Following the super anneal the substrate may be rapidly cooled to avoid undesired diffusion. Further, cooler parts of the substrate may act as a heat sink by interacting with the heated surface until thermal equilibrium is reached between the two. This conductive heat transfer between the cool and hot parts of the substrate may equilibrate more quickly than by relying on radiation losses between the substrate and the surrounding air. Known thermodynamic principles dictating heat transfer may be employed to achieve the desired cool-down times for the specific materials and processes used in various embodiments.

Super anneals overcome many of the disadvantages of RTP systems using Halogen lamps for heating. For example, filament-type Halogen lamps produce broadband energy, much of which cannot be used to heat the active layer of the wafer. To increase the amount of useable wavelengths in the filament-type lamp, power to the lamp may be increased. Unfortunately, in an RTP system, the increase in power shifts the peak intensity. The arc lamp used in the flash anneal does not shift peak intensity with an increase in power and thus can be made to perform at a peak intensity that is within the useable band of wavelengths. Therefore, the added power is more efficiently consumed at the active layer.

A backside heating device may or may not be implemented. If implemented, the backside heating device may preheat a substrate from between two seconds to several minutes at between 250-800 degrees C.

Specifically, the super anneal in an illustrative embodiment may be between about 950-1300 degrees C., and a duration of about 0.2-1.0 milliseconds.

The super anneal alters the resistance and the stress of the silicide layer. The stress of the silicide layer thus processed is greater than 1.0 GPa, as measured on a blanket wafer. Further, the resistance of the silicide film is about 8E-8 ohm cm$^2$. The very short annealing time will reduce the structure relaxing effect. Therefore, the silicide layer will be the more tensile strain effect.

With reference now to FIGS. 2A-6B, there are shown cross-sectional views of the process steps for a work piece including an NMOS and a PMOS structure. NMOS 200 and PMOS 251 comprise substrate 201, gate electrode 202, and sidewall spacer 206. Sidewall liner 204 may be interposed between gate electrode 202, and sidewall spacer 206. Substrate 201 may comprise silicon or other semiconductor material covered by an insulating layer, for example. The substrate may comprise silicon oxide over single-crystal silicon, for example. Substrate 201 may include other conductive layers or other semiconductor elements, e.g. transistors, diodes, etc or other active components or circuits, not shown. Compound semiconductors, GaAs, InP, SiGe, or SiC, as examples, may be used in place of silicon. Substrate 201 may comprise silicon oxide over single-crystal silicon, for example.

NMOS 200 includes a source region 210 and a drain region 212 in substrate 201. PMOS 251 includes source region 256 and drain region 258, formed with a first dopant region 208 (or region of dopants) and a second dopant region 211, respectively. The source region 256 and the drain region 258 are comprised of main strained layer 260 disposed in an etched opening in substrate layer 201. The source/drain regions 256/258 may be etched by a reactive ion etch plasma reactor, for example. The depth of the etch may be in the range of about 30 nm to 100 nm. Main strained layer 260 may be $Si_xGe_y$ (SiGe) for example. Further, main strained layer 260 may be moderately doped with a P-type dopant such as boron. The SiGe layer may be formed in a chemical vapor deposition (CVD) tool or a furnace using, for example, gases such as $SiH_2Cl_2$ or $SiH_4$, as the Si source. $GeH_4$ may be used for the Ge content. The source/drain regions 256/258 may be formed in a process accomplished between, for example, about 500 to 850 C., with a pressure of less than about 500 Torr. Doping levels may be controlled during formation of the source/drain regions 256/258 or doping may be implanted in a separate process using an ion implanter and an anneal process to activate the source/drain regions 256/258.

Moreover PMOS 251 includes capping layer 262, which may be a Si layer, a boron doped Si (SiB) layer, a combination of the layers or the like. The SiB may be formed using gases such as $SiCl_2H_2$ or $SiH_4$ with $B_2H_6$ for boron doping in the Si layer. These layers may be implemented in a chemical vapor deposition (CVD) process. Further, capping layer 262 may be about 100-300 Å thick.

Figure 2A:
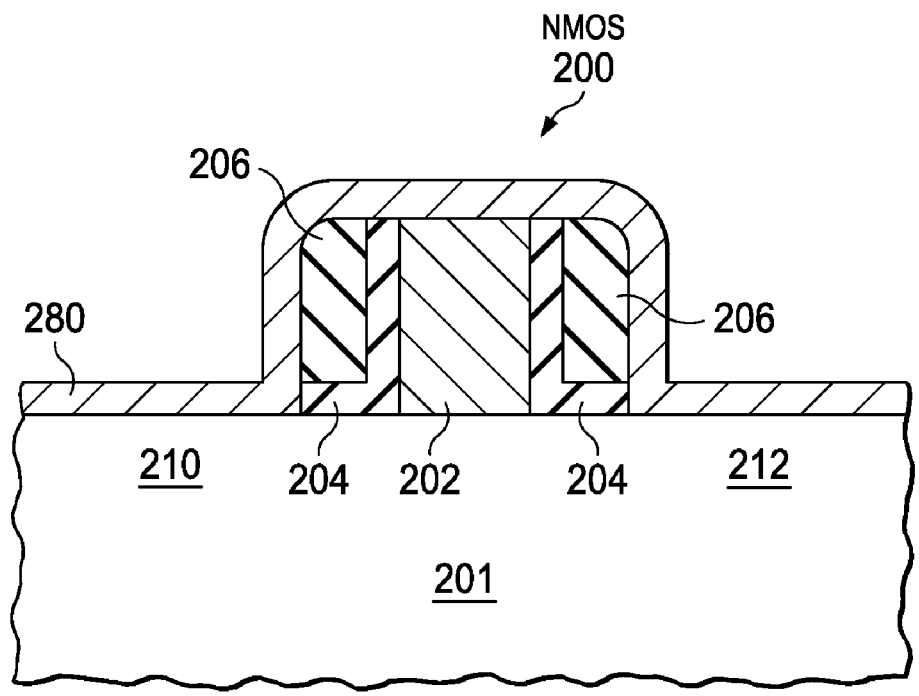
FIGS. 2A and 2B are cross-sectional views of an NMOS and a PMOS intermediate structure following metal disposition.

FIG. 2A shows NMOS 200 and PMOS 251 following a metal disposition. Metal 280 is shown in a layer covering both NMOS 200 and PMOS 251. Metal 280 may be a refractory metal such as, tungsten (W), molybdenum (Mo), niobium (Nb), tantalum (Ta), rhenium (Re) or metal 280 may be Ni, Co, Ti, or the like. Preferably, metal 280 is comprised of Ni. In an embodiment, metal 280 may be a layer of Ni deposited to a thickness between about 30-300 Å at a temperature of 25-500° C. using either radio frequency (RF) sputtering or CVD techniques.

Figure 2B:
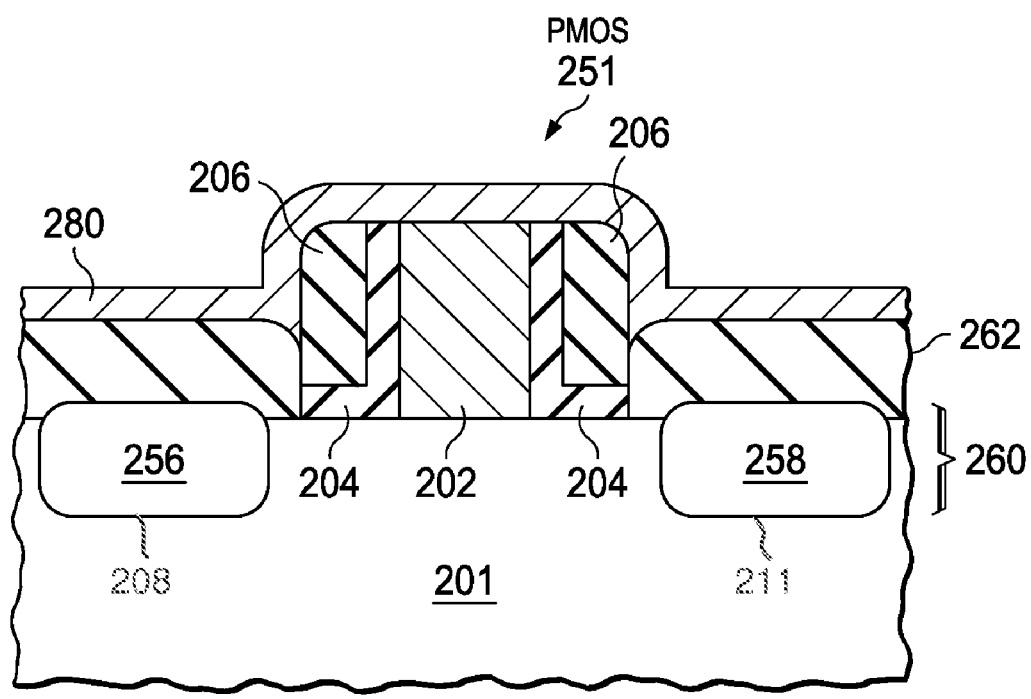

Turning to FIGS. 2A and 2B, the work piece including NMOS 200 and PMOS 251 are subjected to a silicide formation anneal at, for example, a temperature between about 200 and 300 degrees C. for a time between about 20 and 100 seconds. The substrate may be in, for example, a nitrogen ($N_2$) environment during silicide formation anneal. The silicide formation anneal converts the deposited layer of nickel into nickel silicide on NMOS device 200 by stimulating interaction between the deposited layer 280 of nickel and the underlying silicon of the silicon substrate 201 or the silicon of gate electrode layer 202. The silicide formation anneal converts the deposited layer of nickel into nickel silicide on PMOS device 251 by stimulating interaction between the deposited layer 280 of nickel and the underlying silicon of capping layer 262 and the silicon of gate electrode layer 202.

In one embodiment, after the silicide formation anneal has been completed, the unreacted nickel is removed from the substrate. A selective etch to the unreacted nickel may be implemented using a conventional selective wet etch, such as a 2:3 mixture of phosphoric acid ($H_3PO_4$) and hydrogen peroxide ($H_2O_2$), applied for a period of between about 15 and 25 minutes.

Figure 3A:
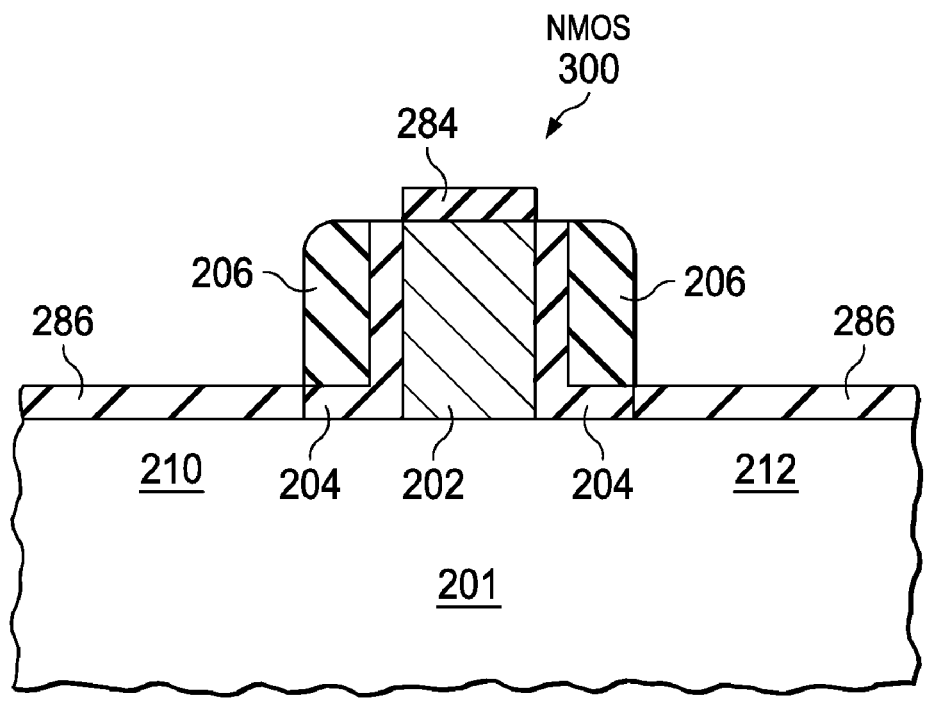
FIGS. 3A and 3B are cross-sectional views of an NMOS and a PMOS intermediate structure following the removal of the un-reactive metal.
Figure 3B:
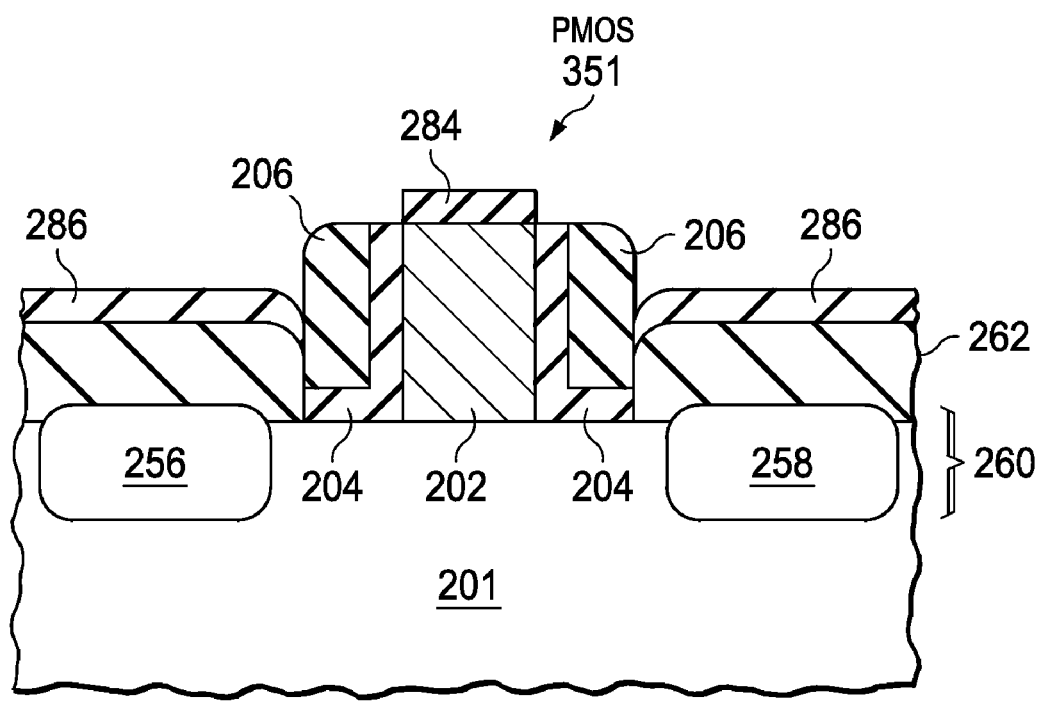

The cross-section that is shown in FIGS. 3A and 3B shows the work piece including NMOS 300 and PMOS 351 structures that have been created up to this point. Self-aligned layers of $NiSi_x$ have been formed in this manner, specifically layer 286 over the surface of the source/drain regions 210/212 and over capping layer 262 in source/drain 256/258 regions. In addition, silicide is formed over the surface of the gate layer 202, in both the NMOS and PMOS devices, in this embodiment. Note that silicide is not formed over the spacers 206 or sidewall liners 204, and that the excess unreacted nickel has been removed from the substrate in these areas. Silicide may be formed over any or all of the source/drain regions and gate regions for both NMOS and PMOS devices within the scope of an embodiment.

Figure 4A:
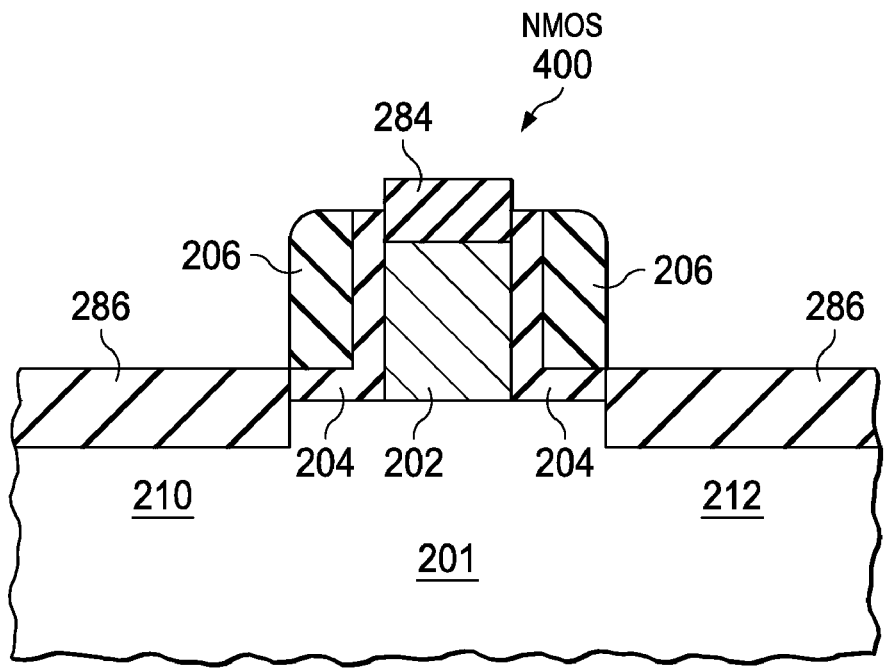
FIGS. 4A and 4B are cross-sectional views of an NMOS and a PMOS intermediate structure following a second RTA anneal.
Figure 4B:
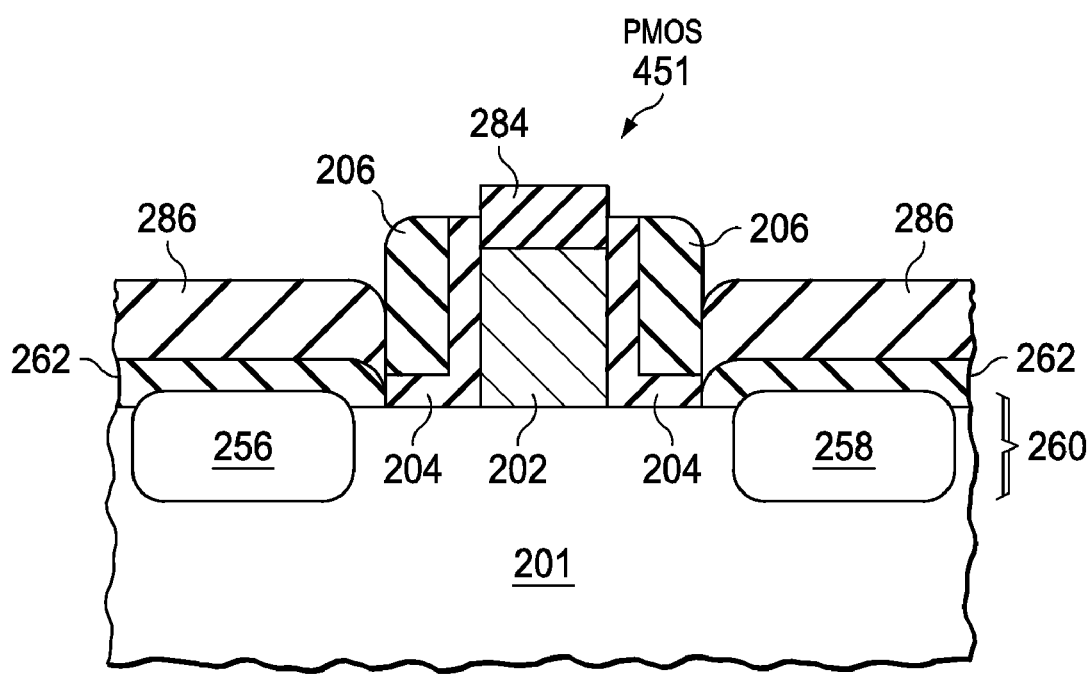

Turning to FIGS. 4A and 4B, the cross-section that is shown includes NMOS 400 and PMOS 451 structures that have been created up to this point, an optional post metal removal anneal has been performed. The post metal removal anneal may be an RTA anneal with temperatures between about 350° C. and 550° C., with a duration between about 15-60 seconds. Note from FIGS. 4A and 4B that the silicide layers 284 and 286 may be thicker following the post metal removal anneal. Silicon may be consumed from the source/drain and gate regions to accommodate the silicide growth.

Figure 5A:
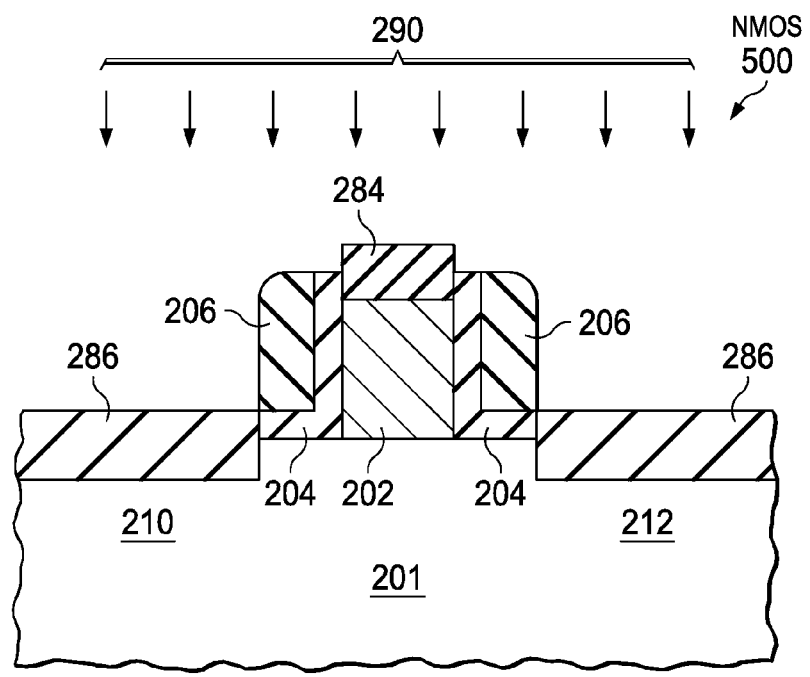
FIGS. 5A and 5B are cross-sectional views of an NMOS and a PMOS intermediate structure showing an implant.
Figure 5B:
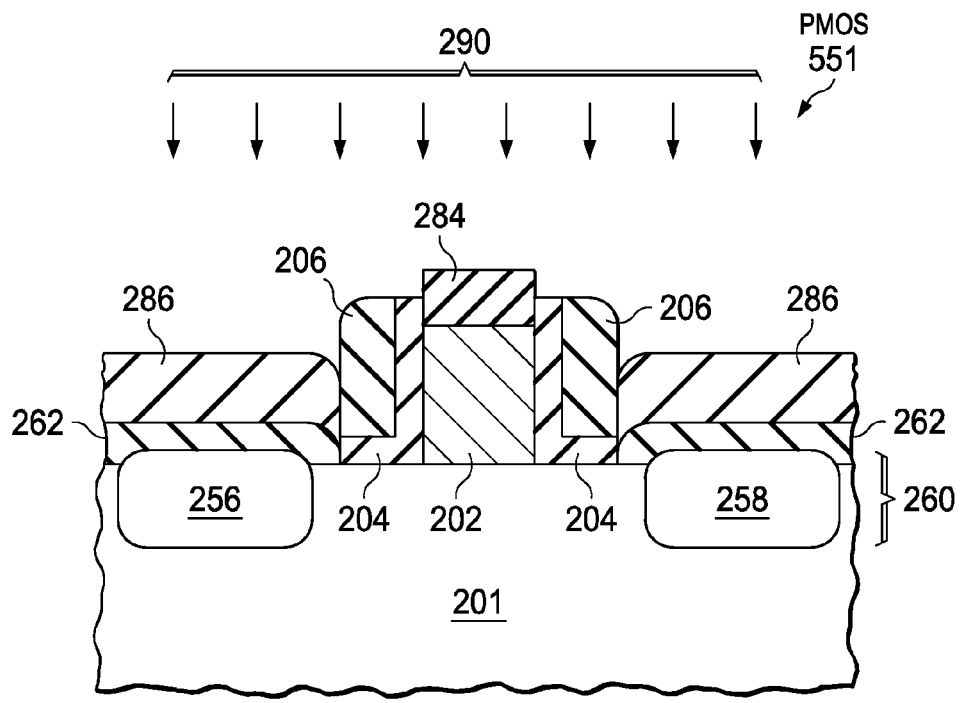

The cross-section that is shown in FIGS. 5A and 5B shows the work piece including NMOS 500 and PMOS 551 structures that have been created up to this point. Turning to FIGS. 5A and 5B, silicon, germanium, or the like ions are implanted by a silicon implantation 290. As mentioned in the FIGS. 1A and 1B discussion above, the order of the steps may be changed within the scope of an embodiment. The ions are implanted into the surface of the gate electrode structure 202 and into the surface of silicided layers 284 and 286. The implant may be performed using an implant concentration of between about 5E14 and 9E15 ions/cm$^2$ at an implant energy of between about 0.2 and 0.9 KeV. The implant concentration and implantation energy can be adjusted and can be selected based on the desired depth of penetration and concentration of implanted ions. In an embodiment, Si ions are implanted into the substrate. An advantage of Si implant is to compensate for the silicon loss during silicide formation. However, other ions such as Ge may be implanted.

Figure 6A:
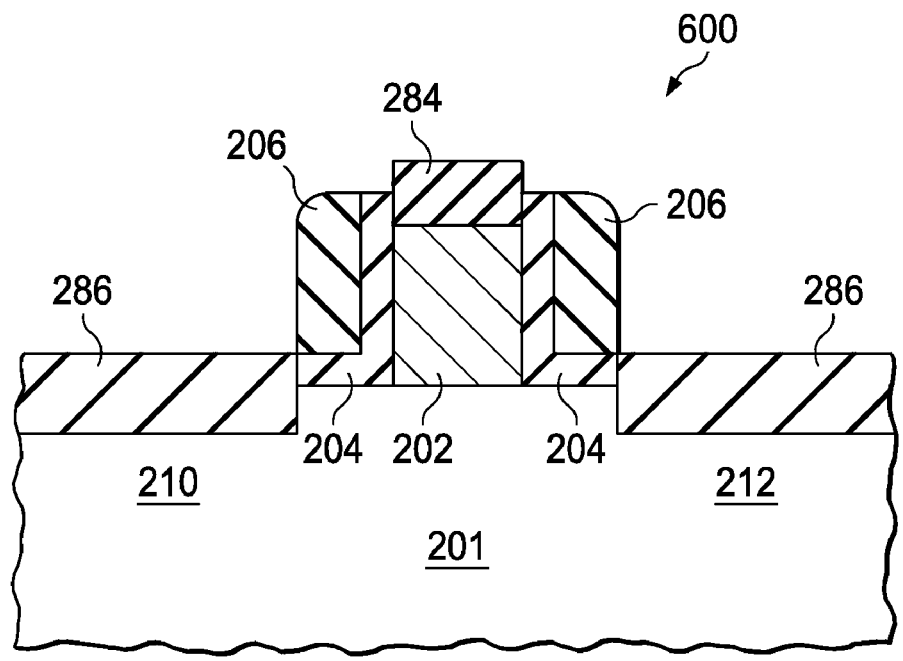
FIGS. 6A and 6B are cross-sectional views of an NMOS and a PMOS intermediate structure following a super anneal.
Figure 6B:
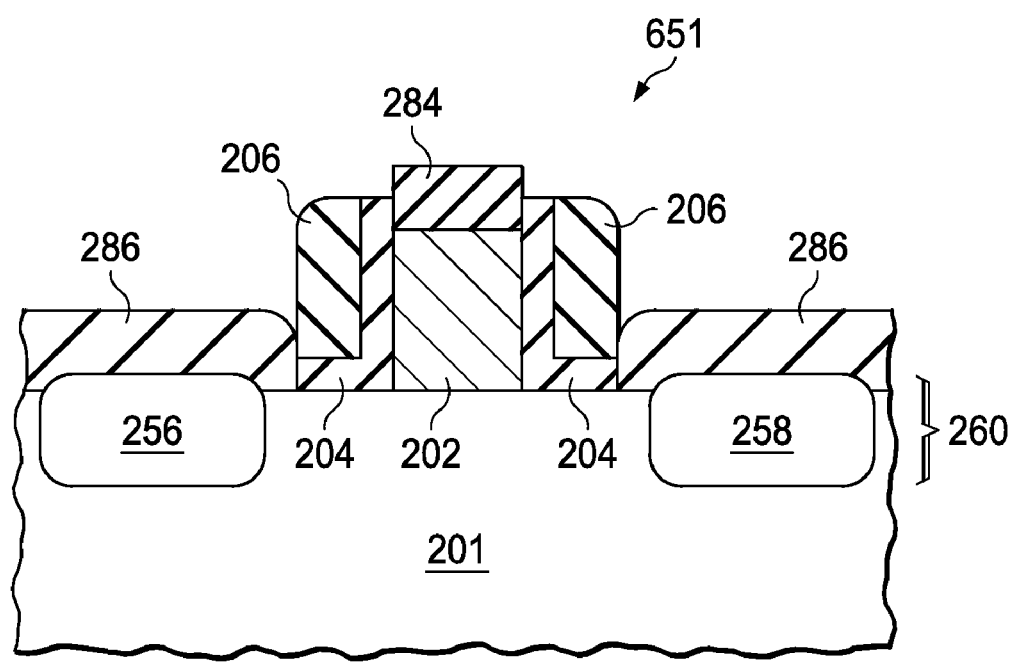

Turning to FIGS. 6A and 6B, a cross-section is shown with the work piece including NMOS 600 and PMOS 651 structures that have been created up to this point. A super anneal of the implanted silicide is employed. As discussed in FIG. 1, a super anneal may provide a stable silicide layer with low sheet resistance and provide the tensile strength that improves device electrical parameters. The post implant flash anneal is performed at between about 950-1300° C. for a duration of between about 0.2-1.0 ms.

Figure 7:
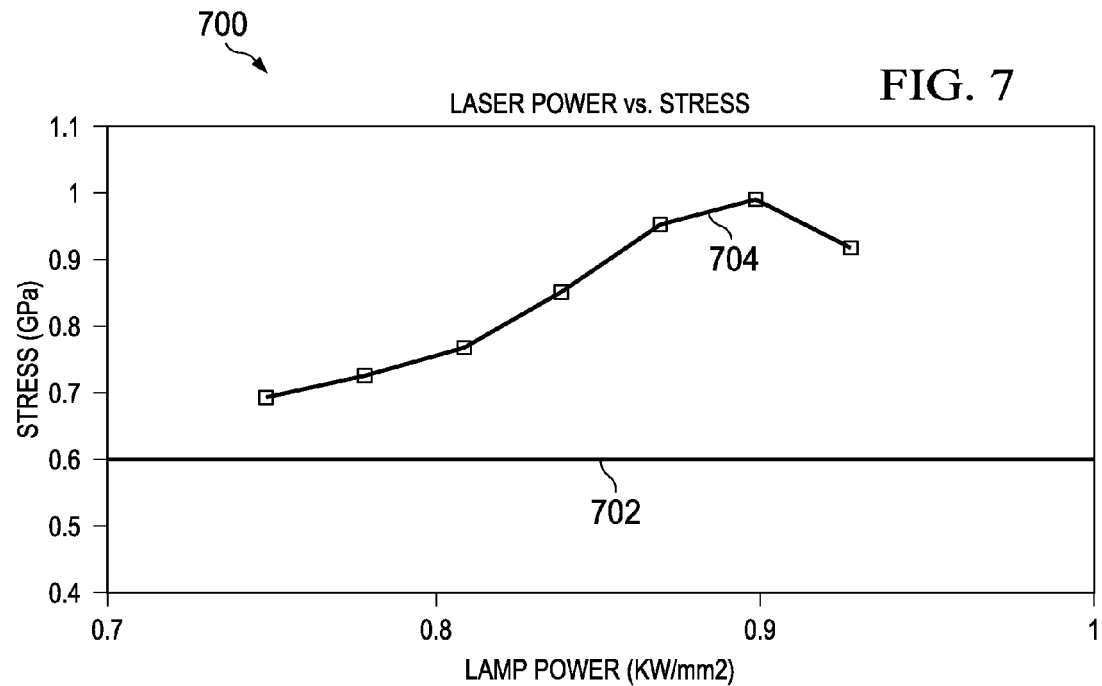
FIG. 7 is a graph of laser power during post implant anneal versus silicide film stress.

Turning to FIG. 7, a graph of stress as measured on a blanket $NiSi_x$ wafer by laser power. As can be seen by graph 700, the tensile stress of a blanket $NiSi_x$ wafer that has undergone a prior art RTA post implant anneal 702 may have a stress value of about 0.6 GPa. In contrast, the laser anneal curve 704 indicates that the stress values increase as the laser power increases until about 0.9 $KW/mm^2$. Therefore, the beneficial stress values may be increased using the super anneal, which in this embodiment is a laser anneal.

Figure 8:
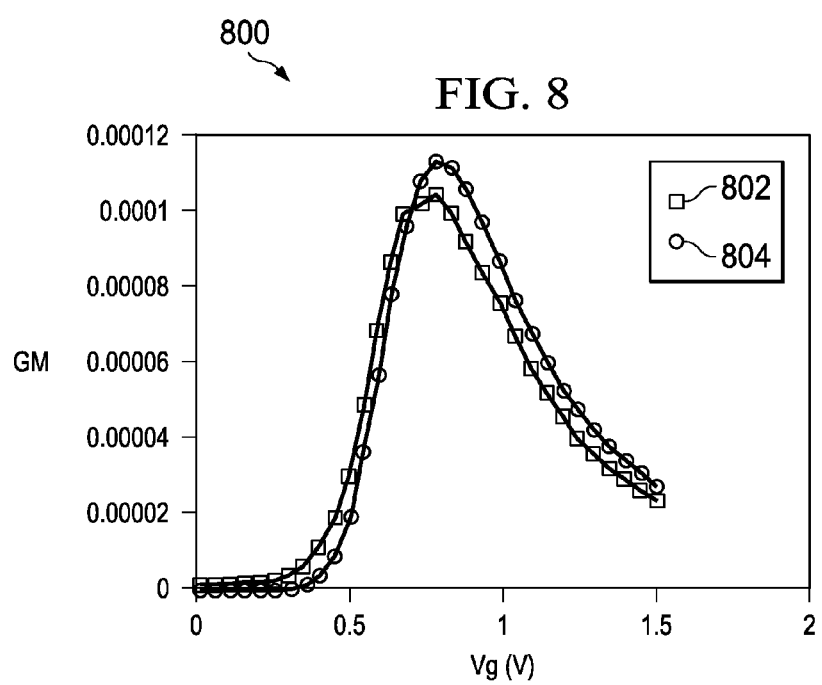
FIG. 8 is a graph comparing the transconductance (GM) versus gate voltage (Vg) on test devices for a prior art method contrasted with a method of an illustrative embodiment.

Turning to FIG. 8, further advantages of an illustrative embodiment are illustrated. As can be seen by graph 800, the transconductance (GM) of the NMOS device may be improved by 9%. GM is an electrical parameter that gives the ratio of gate voltage/drive current. Curve 802 indicates prior art RTA post implant anneal. Curve 804 indicates a super post implant anneal process. Note that the GM value for the super post implant anneal process is greater than the prior art method. Thus, the I-drives of the NMOS devices are improved with an illustrative embodiment.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a metal silicide comprising:
    forming a gate region, a source region, and a drain region in a substrate, wherein the forming the source region and the drain region further comprises forming one or more regions of dopants in the substrate;
    disposing a metal on the substrate;
    performing a silicide formation anneal to form a silicide on the gate region, the source region, and/or the drain region;
    removing an unreacted metal from the substrate;
    performing a post metal removal anneal after the removing the unreacted metal;
    implanting a plurality of ions into the silicide after the performing the post metal removal anneal, the plurality of ions being neither N-type ions nor P-type ions and wherein the implanting the plurality of ions occurs with an energy of less than 1 KeV; and
    performing a post implant anneal of the substrate, wherein the post implant anneal comprises a super anneal performed after the forming the source region and the drain region.

2. The method of claim 1, wherein the metal disposed is selected from a group consisting of Ni, Co, Ti, a refractory metal, and alloys thereof.

3. The method of claim 1, wherein the silicide formation anneal is a rapid thermal anneal (RTA).

4. The method of claim 3, wherein the silicide formation anneal is performed at between about 200-300° C. for a duration of between about 15-60 seconds.

5. The method of claim 1, wherein the super anneal is a flash anneal.

6. The method of claim 1, wherein the super anneal is a laser anneal.

7. The method of claim 1, wherein the plurality of ions are selected from a group consisting of Si, Ge, and compounds thereof.

8. The method of claim 1, wherein the implanting is implemented before removing the unreacted metal.

9. The method of claim 1, wherein the super anneal has a duration of between about 0.2 ms and 10 ms.

10. The method of claim 5, wherein the super anneal has a temperature between about 950-1300° C.

11. A method of forming a metal silicide comprising:
    forming a gate region, a source region, and a drain region in a substrate, wherein the forming the source region further comprises forming a region of dopants;
    forming a silicide on the gate region, the source region, and the drain region;
    implanting a plurality of ions into the silicide, the implanting the plurality of ions occurring with an energy of less than 1 KeV; and
    performing a post implant anneal of the substrate, wherein the post implant anneal comprises a super anneal performed after the forming the source region, the super anneal imparting a stress value of about 1.0 GPa to the silicide.

12. The method of claim 11, wherein the forming the silicide comprises forming a metal layer, performing a silicide anneal, and removing unreacted portions of the metal layer, and wherein the implanting the plurality of ions is performed after the performing the silicide anneal and prior to the removing of the unreacted portions of the metal layer.

13. The method of claim 11, wherein the forming the silicide comprises forming a metal layer, performing a silicide anneal, and removing unreacted portions of the metal layer, and wherein the implanting the plurality of ions is performed after the removing of the unreacted portions of the metal layer.

14. The method of claim 11, wherein the forming the silicide comprises forming a metal layer, performing a silicide anneal, removing unreacted portions of the metal layer, and performing a post metal removal anneal, and wherein the implanting the plurality of ions is performed after the post metal removal anneal.

15. The method of claim 11, wherein the super anneal is a flash anneal.

16. The method of claim 11, wherein the super anneal is a laser anneal.

17. The method of claim 11, wherein the super anneal has a duration of between about 0.2 ms and 10 ms.

18. The method of claim 11, wherein the super anneal has a temperature between about 950-1300° C.

19. The method of claim 11, wherein the plurality of ions are selected from a group consisting of Si, Ge, and compounds thereof.

* * * * *